United States Patent
Appelberg et al.

(10) Patent No.: US 6,788,000 B2
(45) Date of Patent: Sep. 7, 2004

(54) DISTRIBUTED EMERGENCY LIGHTING SYSTEM HAVING SELF-TESTING AND DIAGNOSTIC CAPABILITIES

(75) Inventors: Gustaf T. Appelberg, Fairfield, CT (US); Joseph W. Fleming, Ramsey, NJ (US)

(73) Assignee: E-Lite Technologies, Inc., Trumbull, CT (US)

( * ) Notice: Subject to any disclaimer, the term of this patent is extended or adjusted under 35 U.S.C. 154(b) by 115 days.

(21) Appl. No.: 09/852,676

(22) Filed: May 10, 2001

(65) Prior Publication Data

US 2001/0040798 A1 Nov. 15, 2001

Related U.S. Application Data

(60) Provisional application No. 60/203,878, filed on May 12, 2000.

(51) Int. Cl.[7] .............................. H05B 37/00; H02J 7/00; F21V 19/04
(52) U.S. Cl. .............................. 315/86; 315/91; 307/66; 307/64; 362/20
(58) Field of Search .......................... 315/169.3, 169.4, 315/86, 291, DIG. 4, 209 R, 88, 91; 307/23, 66, 64; 362/20

(56) References Cited

U.S. PATENT DOCUMENTS

| | | | | |
|---|---|---|---|---|
| 3,809,917 A | * | 5/1974 | Vore | 307/131 |
| 3,869,639 A | * | 3/1975 | Herzog | 315/86 |
| 5,343,375 A | * | 8/1994 | Gross et al. | 362/153 |
| 5,724,909 A | * | 3/1998 | Pitman et al. | 116/202 |
| 5,775,016 A | * | 7/1998 | Chien | 40/544 |
| 5,806,960 A | * | 9/1998 | Chien | 362/84 |
| 5,859,499 A | * | 1/1999 | McAfee et al. | 307/128 |
| 6,000,807 A | * | 12/1999 | Moreland | 307/66 |
| 6,265,833 B1 | * | 7/2001 | Kim et al. | 315/169.3 |
| 6,285,132 B1 | * | 9/2001 | Conley et al. | 315/129 |
| 6,307,207 B1 | * | 10/2001 | Burbank | 250/462.1 |

* cited by examiner

Primary Examiner—Tuyet T. Vo
(74) Attorney, Agent, or Firm—Ware, Fressola, Van Der Sluys & Adolphson LLP (57) ABSTRACT

A distributed emergency building lighting system senses the presence or absence of AC power at the input of a switch controlling lighting in a designated area or an input stimulus such as an alarm to provide low-level marking for visual delineation of the path of egress or lighting of a predetermined designated area by illuminating an EL panel in accordance with code requirements. Self-diagnostic testing verifies operational conditions of the battery and illumination circuit to ensure code compliance.

19 Claims, 3 Drawing Sheets

DISTRIBUTED EMERGENCY LIGHTING SYSTEM HAVING SELF-TESTING AND DIAGNOSTIC CAPABILITIES

This application claims the benefit of Provisional application No. 60/203,878 filed May 12, 2000.

BACKGROUND OF THE INVENTION

Technical Field

The present invention relates generally to lighting systems and egress path lighting and deals more particularly with a distributed emergency lighting system having self-diagnostic testing.

Figure 2:
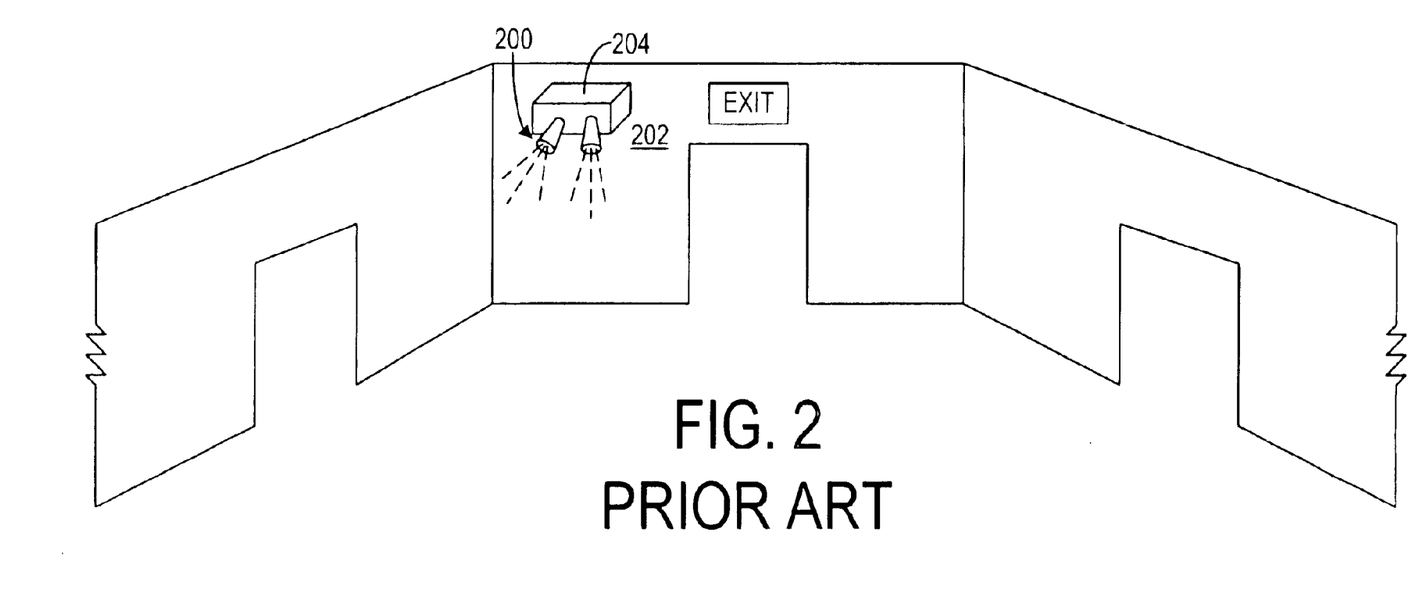
FIG. 2 is a schematic illustration of an area illuminated with "bug eyes" lighting system of the prior art.

It is known to provide emergency guidance systems and emergency lights in buildings. Such prior art lighting systems shown, for example in FIG. 2, are typically centralized and are often characterized by the presence of a spotlight or pair of spotlights 200, also commonly referred to as "bug eyes" that are mounted toward the ceiling on a wall 202 and contain a battery 204 which is rechargeable from an AC supply. On loss of power or receipt of other external input signal, the emergency lights throughout the building illuminate.

UL 924 and UL 1994 dictate the code requirements for emergency lighting and path marking systems. These UL standards specify light intensity at the floor level and automatic triggering in response to an emergency situation. Currently employed triggering sources for buildings that require emergency lighting systems is extremely costly to install and maintain. Use-restricted or dedicated electrical power circuits serve the emergency lighting systems exclusively and cannot be used for general lighting. Major battery backup systems are often required to provide electrical power to the restricted circuits of centralized emergency lighting systems in the event of a power failure. In the event of a power failure, which may be localized to one portion of a building, the emergency lighting system responds to serve the entire building. It is also very difficult to retrofit existing buildings with the emergency lighting systems due to the installation costs and the difficulties in rewiring existing structures with dedicated and restricted circuits.

A further drawback with known emergency lighting systems is the inability to assure that the emergency lighting will be active and capable of providing illumination in response to an emergency condition. Typically, known emergency systems require inspection by a fire marshal or other building inspector on a periodic basis to insure the adequacy and integrity of the lighting system. It is well known that the number of inspectors available to perform such inspections is limited and consequently reinspection of an emergency lighting system may not occur on a regular basis if at all. Infrequent, incomplete or missed inspections present a threat to safety, and numerous recorded instances show that the lack of inspection has resulted in untimely deaths and injuries due to fires.

Even in instances when inspections are made, the location of the bug eye lights are such that the inspectors cannot reach them to activate the testing buttons which must be maintained in a operated position for upwards of an hour to two hours to test the battery reserve. Consequently, a number of the emergency lighting systems are not fully tested for code compliance and reliable operation.

SUMMARY OF THE INVENTION

The present invention provides a distributed emergency lighting system with a triggering mechanism in the form of an alarm, smoke detector, or other sensor or loss of AC power at the light switch or circuit breaker that controls power to the general lighting within an associated room, corridor or other building area. Both the switch and the circuit breaker have a voltage on the input line side whether the lights in the given area are on or off. The line side of the switch or circuit breaker is monitored for the presence of voltage, and in the event of a voltage failure, the emergency lighting system provides illumination in accordance with code requirements within the associated room or area that has lost its power rather than the entire building.

The present invention also monitors and maintains an emergency lighting system in a unique manner. In limited lighting area embodiments of the invention, each time a light switch, circuit breaker or other power control device is operated to power to the lighting in the room or area to be lit, the emergency lighting system is tested for the length of time that the switch is in the operative position for the area that is required by code to have the emergency lighting. In larger lighting area embodiments, such as entire floors of a building, the emergency lighting system is automatically tested in accordance with a code compliant testing schedule. The code requirements and standards for conditions that satisfy the code requirements such as the battery capacity level, the ability for the system to maintain the intended battery load for the code-specified time and other requirements are integrated into a single system with self-diagnostic testing. In the event the system fails to pass the self-diagnostic tests, an alerting signal or alarm is provided to has some problem and will not properly operate in an emergency mode. The alarm can take the form of the emergency lights in the area not coming on, coming on partially, or coming on in a flashing pattern to alert the user that the emergency lighting system has a problem that requires immediate attention.

In a first aspect of the invention, a distributed emergency building lighting system comprises an electroluminescent (EL) panel, means for providing electrical power to illuminate the EL panel and a control circuit electrically coupled to the electrical power source and the EL panel to illuminate a predetermined designated area within the building in response to an input stimulus such as for example, a pull fire alarm, smoke detector, commercial power failure and the like.

Preferably, the illuminated predetermined designated area further comprises low-level path marking to provide visual delineation of the path of egress.

Preferably, the illuminated predetermined designated area further comprises floor illumination within a prescribed distance from at least one wall of a room in accordance with code requirements.

Preferably, the EL panel is a stripe of indeterminate length located in one or more designated areas including on a floor and on a wall at or near the floor in accordance with code requirements.

Preferably, the EL panel is an exit sign at or near floor level.

Preferably, the electrical power source is an EL power supply and has an input coupled to the line side of an electrical switch supplying commercial AC power to the conventional lighting located in the designated area and to a DC voltage source in the absence of AC voltage at the line side of the electrical switch.

Preferably, the EL power supply includes means for adjusting the light intensity of the EL panel to a desired intensity.

Preferably, the control circuit includes self-diagnostic testing means for verifying operational conditions of the lighting system including the detection of an electrical short circuit and an electrical open circuit of an EL panel coupled to the control circuit.

Preferably, the self-diagnostic testing means includes means for determining normal circuit operation.

Preferably, the self-diagnostic testing means includes means for determining an inoperative EL power supply.

Preferably, the self-diagnostic testing means includes testing means for determining the charge capacity of the battery.

Preferably, the battery testing means includes means for connecting a test electrical load to the battery for a predetermined short time interval; means for sensing the battery voltage during the short time interval that the test electrical load is connected, and means for providing an alarm indication in response to the battery voltage falling below a predetermined voltage value during the voltage sensing time interval.

Preferably, the system includes means for activating the self-diagnostic testing means in accordance with a predetermined time schedule or manually activating the self-diagnostic testing means.

Preferably, the self-diagnostic testing means is activated in response to turning the conventional lighting located in the designated area on and off.

Accordingly, it is an object of the present invention to provide a distributed emergency lighting system that can be retrofitted into existing buildings.

It is a further object of the present invention to provide an emergency lighting system that is small and compact and contains self-diagnostic testing to verify code compliance requirements.

It is a further object of the present invention to provide an emergency lighting system that provides a visual indication to a user that one or more diagnostic tests have failed and require immediate attention.

It is a further object of the present invention to provide an emergency lighting system which also provides emergency egress path lighting.

It is a further object of the present invention to provide an emergency lighting system that includes automatic testing of the system at pre-selected times regardless of the operation of the light switch or circuit breaker that provides power to the lighting system.

It is a further object of the present invention to provide an emergency lighting system that can also be used for theater aisle lighting to provide emergency lighting, egress lighting or general lighting.

It is a further object of the present invention to provide an emergency lighting system that can be interfaced from a control panel.

BRIEF DESCRIPTION OF THE DRAWINGS

Other objects, features and advantages of the present invention will become readily apparent from the following written description of preferred embodiments taken together with the drawings wherein.

DESCRIPTION OF PREFERRED EMBODIMENTS

Figure 1:
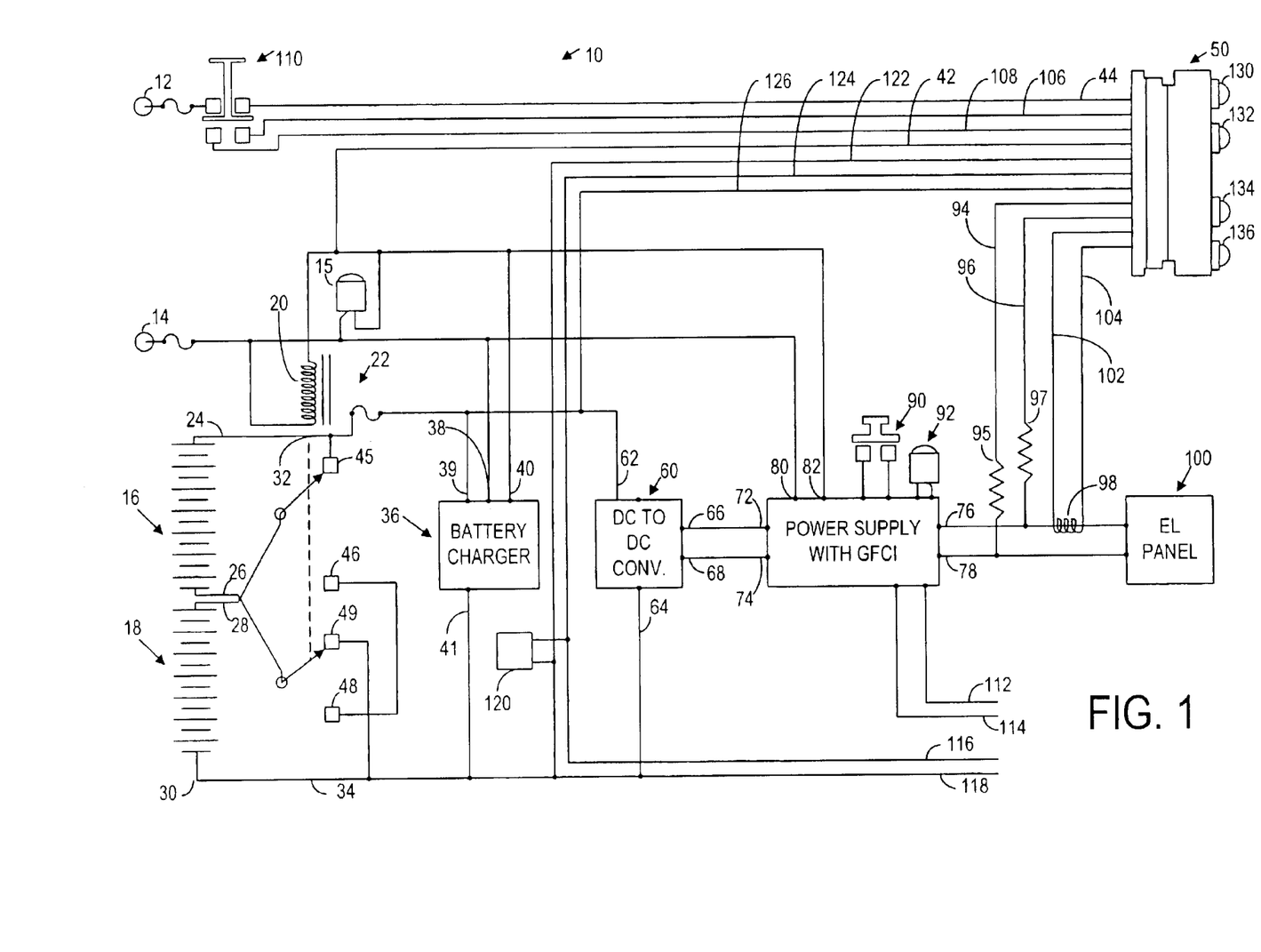
FIG. 1 is an electrical schematic functional block diagram of the emergency lighting system embodying the present invention.

Turning now to the drawings and considering the invention in further detail, a schematic functional block diagram of the distributed emergency building lighting system embodying the present invention is illustrated in FIG. 1 and is generally designated 10. The system 10 electrically connects to the AC input power side of a light switch or circuit breaker (not shown) via terminals 12, 14. Typically the emergency lighting system is used with a 120 volt AC lighting, however the present invention may be used with any voltage commercial power lighting system by appropriate component selection to accommodate the different voltage potentials available to provide electrical power to the emergency lighting system. The emergency lighting system switches to DC voltage battery operation in the event of a power failure or in response to other triggering events, such as a pull fire alarm, smoke detector, sprinkler head operation and the like. A pilot lamp 15 indicates that AC power is present across the terminals 12, 14.

In a limited lighting area version, such as a single room for example, as described in further detailed hereinbelow in connection with FIG. 3, the components of the emergency lighting system can be mounted in a conventional light switch box 230 and recessed within a wall or mounted in any convenient well-known manner on the wall or other desired location to permit retrofitting to a desired area or several areas on an individualized basis; that is, one system per area in existing buildings. In a larger lighting area version, such as an entire floor for example, the components of the emergency lighting system can be mounted in a NEMA enclosure to provide the additional space necessary to accommodate the larger components associated with a larger system.

The batteries 16, 18 that are used in the limited area versions of the lighting system to power the EL power supply to provide illumination as described below are relatively small and literally the size of a conventional 9-volt battery case. The batteries may be nickel metal hydride or other compact high amperage capacity battery construction well known to those in the battery art.

In the larger lighting area versions of the lighting system, the batteries 16, 18 are typically lead acid batteries to provide the necessary volt/ampere reserve capacity to illuminate the larger designated area for the code required time. Batteries other than lead acid batteries providing the required reserve may also be used. When AC power is present across the terminals 12, 14, a 120-volt AC double-pole, relay coil 20 of a double-throw relay 22 is energized to transfer the respective battery terminals 24, of battery 16 and battery 18 such that the batteries 16, 18 are electrically in parallel across the line 32, 34 for charging by the battery charger, generally designated 36. The battery charger 36 input 38, 40 is connected to the 120-volt AC input. As illustrated, input 38 is coupled to terminal 14 and input 40 is coupled to terminal 12 through a loop-around on leads 42, 44 of the self-diagnostic test module, generally designated 50. The output 39, 41 of the battery charger 36 is coupled to the battery terminals 24, 28 and 26, 30, respectively, through the relay transfer contacts 45, 49.

In the event that AC power is lost, that is, the 120 volts AC is no longer present at the terminals 12, 14, the relay coil 20 is no longer energized and the relay transfer contacts 46, 48 connect the batteries 16, 18 in electrical series to provide 24 volts DC across the input 62, 64 of a 24-volt to 300-volt DC-to-DC converter, generally designated 60. The output voltage of the DC-to-DC converter 60 on leads 66, 68 is coupled to the DC input 72, 74 of a ballast or EL power supply, generally designated 70. The output 76, 78 of the EL power supply 70 is coupled to the electroluminescent (EL) panel or lamp, generally designated 100.

The AC voltage inputs 80, 82 of the EL power supply 70 are also coupled to the AC power input terminals 12, 14 to provide a voltage at the output 76, 78 to power the EL lamp 100 when AC power is present and the EL power supply 70 receives an appropriate control signal to cause the EL power supply to become operative. The EL power supply 70 includes an electronic ground fault circuit interrupter (GFCI) and includes a test switch 90 to test the GFCI circuit and a pilot lamp 92 to provide an indication as to the operating condition of the EL power supply 70. The pilot lamp 92 LED lights when the electronic ground fault circuit interrupter circuit means is operated that is, a fault is detected. A suitable EL power supply for use in the emergency lighting system of the present invention is available from E-Lite Technologies, Inc., assignee of the present invention.

The self-diagnostic test module 50 includes circuit components including logic circuits and an instruction set to provide the diagnostic tests for code compliance and other desired testing. The instruction set may be part of a CPU, logic chip or other device now known or future-developed to carry out the intended testing function. The self-diagnostic test module 50 monitors the 120-volt AC input on leads 42, 44. The output 76, 78 of the EL power supply 70 is coupled to the self-diagnostic test module 50 via leads 94,96 to monitor the voltage output signal from the EL power supply 70. A current sense coil 98 monitors the load current on the lead 76 provided to the EL lamp 100. The output of the current sense coil 98 is input to the self-diagnostic test module 50 on leads 102, 104.

The self-diagnostic test module 50 includes a loop-around diagnostic test when the test switch 110 is operated to cause the leads 106, 108 to be connected through the self-diagnostic test module 50. This test removes one side of the AC power and causes the system to switch to DC battery operation. External control signals, such as from a fader control panel or other external control circuit, may be connected to the EL power supply 70 on leads 112, 114 to provide an external input control signal to the EL power supply and consequently to control or regulate the voltage signal applied to the EL lamp 100. Such a signal could provide dimming or flashing of the EL lamp as the circumstances prescribe. Additional control signal input to the emergency lighting system 10 can be provided on leads 116, 118. The input signals are monitored such as, for example, by a volt meter, a voltage indicator of some type such as a LED or bar LED panel circuit means 120. The input signals on leads 116, 118 are also coupled to the self-diagnostic test module 50 on leads 122, 124.

The self-diagnostic test module 50 includes LEDs or indicators 130, 132, 134, 136 which provide an indication to a user of the condition of the emergency lighting system and the status and state of the self-diagnostic tests on the system. The self-diagnostic test module 50 is arranged to operate with a manually actuated test button or preferably is configured to automatically cycle through the diagnostic tests at predetermined times or in response to the actuation of the light switch in the room or area where the lights are located.

The self-diagnostic tests run from simple tests to complex tests and include monitoring of the battery voltage level, the operation of the charging circuitry, the operation of the 24-volt DC-to-DC step up converter, the EL power supply controller circuit operation, the condition of the EL lamp as an open circuit or short circuit condition and as a normal load condition on the EL power supply. The self-diagnostic test for the battery utilizes the charge/discharge characteristic curve of the specific battery. The diagnostics can determine the charge on the battery by examining the charge/discharge curve under a load condition and by applying a load equal to approximately 10 to 20 times the normal load presented by the emergency lighting system. The additional test electrical load in the module 50 is connected during the test interval and is supplied via the leads 124, 126. Battery manufacturers represent that a good approximation of the battery life can be obtained in a relatively short time of approximately five to ten seconds that the large test electrical load is applied and monitoring to determine if the battery voltage falls below a predetermined threshold value. Although five to ten seconds is deemed by battery manufacturers to be sufficient for a valid test, the test of the emergency lighting system of the present invention applies a large test electrical load in the range of 20 to 30 seconds to ensure adequate battery charge capacity.

The self-diagnostic test module 50 senses the voltage output from the EL power supply 70 using a comparator across lines 94, 96 through high ohmic value resistors 95, 97 and senses the current supplied to the EL lamp 100 via the sensing coil 98. The logic circuit means of the self-diagnostic test module 50 determines the status of the EL lamp circuit and EL power supply as follows: open EL lamp circuit: senses voltage but no current; shorted EL lamp circuit: senses current but no voltage; normal operating EL lamp circuit: senses both voltage and current; and, sensing no voltage and no current indicates that the EL power supply 70 is defective.

The LEDs 130, 132, 134, 136 can be lit in any sequence with one LED sensing DC to show that the battery is charging, another LED to sense that the battery voltage is at an acceptable level, and if all four LEDs are lit, indicating that the monitoring circuits are all operating properly, and if one LED is not lit an alarm or trouble condition is indicated. The sequencing and combination of the LEDs being lit to indicate operational status are not crucial.

Figure 3:
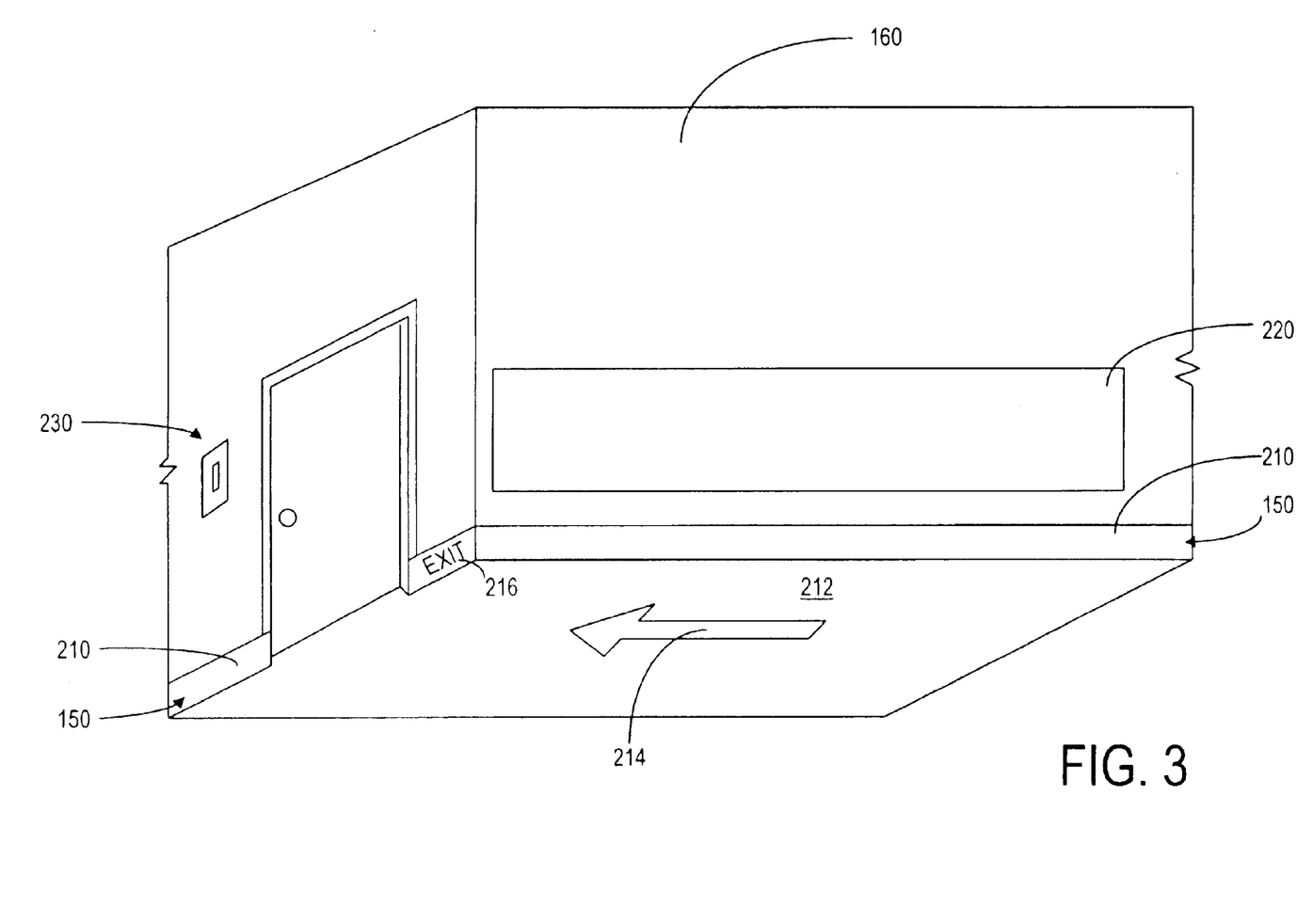
FIG. 3 is a schematic illustration of an area illuminated by the distributed emergency lighting system of the present invention.

As schematically illustrated for example FIG. 3, illumination or emergency low-level path marking 150 of the predetermined designated area 160 is provided by a strip of electroluminescent (EL) lamp material 210 approximately two inches wide or of any suitable width which is mounted along the floor 212 or in the vicinity of the baseboard area of a room or other area to provide a visual delineation of the path of egress 214 in an emergency condition or to illuminate an "EXIT" sign 216 placed at floor level. The illumination of the area 160 to be lit by the emergency lighting system is provided from an electroluminescent (EL) panel strip 220 of indeterminate length that is mounted on the wall along the baseboard of a room or other such area required to be lit in accordance with the code requirements to place the required amount of illumination intensity on the floor surface 212. The emergency lighting system of the present invention overcomes another disadvantage associated with the "bug eye" type emergency lighting systems in which the bug eye lights are typically mounted near the ceiling. In the event of a fire, smoke rises and diffuses and reduces the illumination capabilities of a bug eye emergency light. In contrast, mounting the electroluminescent (EL) strip 220 on the wall along the baseboard provides light on the floor area where the light is required and such illumination would not be affected by smoke until the room is substantially smoke-filled. In addition, providing the electroluminescent (EL) strip 210 along the baseboard allows existing building structures to be retrofitted with emergency lighting at a substantial cost savings and time savings over conventional emergency lighting systems using dedicated electrical circuits. Additionally, the emergency lights can be placed specifically where needed such as in interior, windowless rooms, staircase hallways and other such areas.

A distributed emergency building lighting system has been described above in several embodiments. It will be recognized that the present invention may be used in numerous other embodiments without departing from the spirit and scope of the described embodiments, which are therefore presented by way of illustration rather than limitation.

What is claimed is:

1. A distributed emergency lighting system for use in a building having one or more conventional lighting system areas powered from a source of alternating current (AC) voltage, said distributed emergency lighting system comprising:

an electroluminescent (EL) panel stripe;

a source of direct current (DC) voltage;

means electrically coupled to said DC voltage source for providing electrical power to said EL panel strip;

said electrical power means further comprising control means for illuminating automatically without operator intervention said EL panel stripe from a non-illuminated state to an illuminated state for a predetermined designated lighting area of the one or more conventional lighting system areas within the building in response to an emergency input triggering event; and wherein said power means further comprises an EL power supply having an input coupled to the line side of an electrical switch supplying commercial AC power to the conventional lighting located in said designated area and to said DC voltage source in the absence of AC power at the line side of said electrical switch.

2. The distributed emergency lighting system as defined in claim 1, wherein said EL panel stripe is illuminated in said predetermined designated area for providing floor illumination within a prescribed distance from at least one wall of a room in accordance with emergency lighting code system requirements.

3. The distributed emergency lighting system as defined in claim 1, wherein said EL power supply further includes means for adjusting the light intensity of the EL panel to a desired density.

4. The distributed emergency lighting system as defined in claim 1, wherein said EL panel stripe is illuminated in said predetermined designated area for providing low-level path marking indicating a visual delineation of the path of egress.

5. The distributed emergency lighting system as defined in claim 4, wherein said EL panel stripe is a stripe of indeterminate length located on a floor and on a wall at or near the floor in the predetermined designated lighting area of the one or more lighting areas accordance with emergency lighting code system requirements.

6. The distributed emergency lighting system as defined in claim 4, wherein said EL panel stripe is illuminated to light an exit sign at or near the floor in accordance with emergency lighting code system requirements.

7. A distributed emergency lighting system for use in one or more conventional lighting system areas in a building powered from a source of alternating current (AC) voltage, said distributed emergency lighting system comprising:

an electroluminescent (EL) panel stripe;

a source of direct current (DC) voltage;

means electrically coupled to said DC voltage source for providing electrical power to said EL panel strip wherein said electrical power means further comprising controller means for illuminating automatically without operator intervention said EL panel strip from a non-illuminated state to an illuminated state for a predetermined designated conventional lighting system area of the one or more conventional lighting system areas within the building in response to an emergency input triggering event, and self-diagnostic circuit testing means electrically coupled to said electrical power means and said EL panel stripe and said controller means for verifying operational conditions of the lighting system including the detection of an electrical short circuit and an electrical open circuit of an EL panel coupled to said control means.

8. The distributed emergency lighting system as defined in claim 7, wherein said self-diagnostic circuit testing means includes detection of normal operating circuit of an EL panel coupled to said control means.

9. The distributed emergency lighting system as defined in claim 7, wherein said self-diagnostic circuit testing means includes detection of an inoperative electrical power means.

10. The distributed emergency lighting system as defined in claim 7, further comprising means for activating said self-diagnostic testing means in accordance with a predetermined time schedule.

11. The distributed emergency lighting system as defined in claim 7, further comprising means for manually activating said self-diagnostic testing means.

12. The distributed emergency lighting system as defined in claim 7, further comprising means for activating said self-diagnostic testing means in response to the conventional lighting system located in said designated area being turned on and off.

13. The distributed emergency lighting system as defined in claim 7, wherein said DC source further comprises a battery and said self-diagnostic circuit testing means further comprises testing means for determining the charge capacity of the battery.

14. The distributed emergency lighting system as defined in claim 13, wherein said battery testing means further comprises means for connecting a test electrical load to the battery for a predetermined short time interval;

means for sensing the battery voltage during the short time interval that said test electrical load is connected, and means for providing an alarm indication in response to the battery voltage falling below a predetermined voltage value during the sensing time interval.

15. The distributed emergency lighting system as defined in claim 14, wherein the test electrical load is in the range of 10 to 20 times the electrical load of the emergency building lighting system.

16. The distributed emergency lighting system as defined in claim 15, wherein said predetermined short time interval is in the range of 10 to 30 seconds.

17. A distributed emergency building lighting system comprising:

an electroluminescent (EL) panel;

means for providing electrical power to illuminate said EL panel; and control means electrically coupled to said electrical power means and said EL panel for illuminating a predetermined designated area within the building in response to an input stimulus;

wherein said power means further comprises an EL power supply having an input coupled to the line side of an electrical switch supplying commercial AC power to the conventional lighting located in said designated area and to a DC voltage source in the absence of AC power at the line side of said electrical switch, and wherein said EL power supply further includes means for adjusting the light intensity of the EL panel to a desired intensity.

18. The distributed emergency building lighting system as set forth in claim 17, wherein said control means further includes self-diagnostic testing means for verifying operational conditions of the lighting system including the detection of an electrical short circuit and an electrical open circuit of an EL panel coupled to said control means.

19. A distributed emergency building lighting system comprising:

an electroluminescent (EL) panel;

means for providing electrical power to illuminate said EL panel;

controller means electrically coupled to said electrical power means and said EL panel for illuminating a predetermined designated conventional lighting area within the building in response to an input stimulus;

said power means for providing power to illuminate said EL panel further comprising an EL power supply having an input coupled to the line side of an electrical switch supplying commercial AC power to the conventional lighting located in said designated area and in the absence of AC power at the line side of said electrical switch to a DC voltage source;

said EL power supply further including means for adjusting the light intensity of the EL panel to a desired intensity, and said controller means further including self-diagnostic testing means for verifying operational conditions of the lighting system including the detection of an electrical short circuit and an electrical open circuit of an EL panel coupled to said controller means.

\* \* \* \* \*

UNITED STATES PATENT AND TRADEMARK OFFICE
CERTIFICATE OF CORRECTION

PATENT NO. : 6,788,000 B2
DATED : September 7, 2004
INVENTOR(S) : Appelberg et al.

It is certified that error appears in the above-identified patent and that said Letters Patent is hereby corrected as shown below:

Column 2,
Line 30, after "to" insert -- alert the user that the system --.

Column 4,
Line 55, "24," should be -- 24, 28 --.

Column 6,
Line 44, after "example" insert -- in --.

Column 7,
Line 49, "density" should be -- intensity --.

Column 8,
Line 53, before "sensing" insert -- voltage --.

Signed and Sealed this

Fourteenth Day of December, 2004

JON W. DUDAS
*Director of the United States Patent and Trademark Office*

UNITED STATES PATENT AND TRADEMARK OFFICE
CERTIFICATE OF CORRECTION

PATENT NO. : 6,788,000 B2
DATED : September 7, 2004
INVENTOR(S) : Appelberg et al.

It is certified that error appears in the above-identified patent and that said Letters Patent is hereby corrected as shown below:

<u>Title page</u>,
Item [75], Inventors, after "(US)" -- Douglas A. George, Watertown, CT (US) -- should be added.

<u>Column 2</u>,
Line 30, after "to" -- alert the user that the system -- should be inserted.

<u>Column 4</u>,
Line 55, "24," should be -- 24, 28 --.

<u>Column 6</u>,
Line 44, after "example" -- in-- should be inserted.

<u>Column 7</u>,
Line 49, "density" should be -- intensity --.

<u>Column 8</u>,
Line 53, before "sensing" -- voltage -- should be inserted.

Signed and Sealed this

Eighth Day of February, 2005

JON W. DUDAS
*Director of the United States Patent and Trademark Office*